United States Patent [19]

Segan

[11] Patent Number: 6,023,576

[45] Date of Patent: Feb. 8, 2000

[54] FAST TRANSIENT CIRCUIT SIMULATION OF ELECTRONIC CIRCUITS INCLUDING A CRYSTAL

[75] Inventor: Scott A. Segan, South Whitehall Township, Lehigh County, Pa.

[73] Assignee: Lucent Technologies Inc., Murray Hill, N.J.

[21] Appl. No.: 08/905,540

[22] Filed: Aug. 4, 1997

[51] Int. Cl.[7] .............................. G06F 17/50; H03H 9/00
[52] U.S. Cl. .................................. 395/500.35; 395/500.26
[58] Field of Search ...................... 364/578; 395/500.35, 395/500.26, 500.36

[56] References Cited

U.S. PATENT DOCUMENTS

| | | | |
|---|---|---|---|
| 4,493,062 | 1/1985 | Mallett ...................................... | 367/32 |
| 4,574,257 | 3/1986 | Kasperkovitz et al. ............ | 331/116 R |
| 4,918,643 | 4/1990 | Wong . | |
| 4,973,922 | 11/1990 | Embree et al. ..................... | 331/108 D |
| 5,047,971 | 9/1991 | Horwitz . | |
| 5,051,911 | 9/1991 | Kimura et al. . | |
| 5,150,081 | 9/1992 | Goldberg ................................ | 331/109 |
| 5,278,770 | 1/1994 | Gore et al. . | |
| 5,313,398 | 5/1994 | Rohrer et al. . | |
| 5,610,833 | 3/1997 | Chang et al. . | |
| 5,787,004 | 7/1998 | Schmidt-Kreusel et al. ............. | 702/75 |

OTHER PUBLICATIONS

Horenstein; "Microelectronic Circuits and Devices"; Prentice Hall; pp. 708–713 and 867–883, 1990.

Schure; "Crystal Oscillators"; John F. Rider Publisher, Inc.; pp. v–vii, 1–5 and 12–15, 1955.

Zadeh; "A Micropower Battery–Operated One–Pin Crystal Oscillator"; IEEE Circuits and Systems Symp.; pp. 1382–1387, Aug. 1993.

Lu et al.; "Analysis of Start–Up Characteristcs of Crystal Oscillators"; IEEE Frequency Control Conf.; pp. 360–363, May 1991.

Rice et al.; "Simulation of Crystal Oscillator Circuits"; IEEE Frequency and Control Synthesis Conf.; pp. 53–57, 1989.

Toki et al.; "Analysis of Start–Up Characteristics of CMOS Crystal Oscillators"; IEEE Frequency Control Symp.; pp. 448–452, May 1992.

Voigt et al.; "A New Approach to Determine the Start–Up Time of Sinusoidal Oscillators"; IEEE Circuits and Systems—Proceedings; pp. 1119–1122, Aug. 1994.

Ferris et al.; "Simulating Oscillators Using SPICE"; IEEE Circuits and Systems; pp. 28–34, May 1996.

Rusznyak; "Start–Up Time of CMOS Oscillators"; IEEE Trans. Circuits and Systems; pp. 259–268, Mar. 1987.

Unkrich et al; "Conditions for Start–Up in Crystal Oscillators"; IEEE J. Solid–State Circuits; pp. 87–90, Mar. 1982.

Efstathiou; "An Algorithm for Numerical Analysis of Oscillator Including the Shifting Bias of Active Element"; IEEE Frequency Control and Synthesis Conf.; pp. 45–48, 1989.

Brendel et al.; "Computer Aided Design of Quartz Crystal Oscillators"; IEEE Frequency Control Symp.; pp. 559–566, Jun. 1994.

Vittoz et al.: High–Performance Crystal Oscillator Circuits: Theory and Application; IEEE J. Solid State Circuits; pp.774–783, 1988.

*Primary Examiner*—Kevin J. Teska
*Assistant Examiner*—Hugh Jones

[57] ABSTRACT

The simulation of the output of a crystal circuit is greatly accelerated to steady state by altering the conventional model of a physical crystal to include a constant current source. The constant current source has an oscillating output which is temporarily inserted into the simulated circuit by driving current for only a certain length of time, e.g., for only once cycle of a frequency chosen to correspond to the resonant frequency of the crystal being modeled. The output current of the current source is thereafter forced to zero to effectively remove it from the simulated circuit. The peak current amplitude of the current source is initially selected based on parameters of the crystal being modeled, and estimated by formula, then empirically adjusted if necessary to obtain fast simulation results of the crystal circuit to a steady state. A look-up table can be implemented in SPICE or any other circuit simulation tool to implement the current source in the crystal model.

24 Claims, 5 Drawing Sheets

FAST TRANSIENT CIRCUIT SIMULATION OF ELECTRONIC CIRCUITS INCLUDING A CRYSTAL

BACKGROUND OF THE INVENTION

1. Field of the Invention

This invention relates to circuit simulation techniques. More particularly, it relates to an acceleration of the simulation of a circuit including a crystal.

2. Background of Related Art

Circuit simulation techniques are invaluable for integrated circuit manufacturers. These techniques simulate the transient, ac and/or dc electrical characteristics of a given circuit operating under given conditions even before the integrated circuit is actually manufactured. Integrated circuit designs continue the trend of becoming more densely populated with components, each of which may affect the electrical characteristics of other components, and each of which adds to the complication of the simulation and requires additional computational time.

Accuracy in the modeling of electrical components used in the simulated circuit and their respective electrical properties is very important to the achievement of useful results, but higher accuracy requires more complicated calculations and additional computer time. For instance, some of the properties of a crystal which are important in modeling a circuit driving the crystal include the parallel capacitance, series resistance, and frequency of the crystal. A conventional simulation model of a quartz crystal is shown in FIG. 5.

FIG. 5 shows a conventional crystal model 120 connected through a series resistor 112 to a processor 102. Capacitors 114, 116 couple the input and output nodes of crystal model 120 to ground.

The crystal circuit is modeled in a computer application simulation program such as SPICE, with inherent characteristics of some components being approximated by imaginary passive components. For instance, the capacitance of the quartz crystal in FIG. 5 is modeled with a series capacitance capacitor 104 connected between the input and output nodes of the crystal model 120. The series resonant frequency of the crystal is modeled as a capacitor 106 in series with an inductor 110. The parallel resonant frequency of the crystal is modeled as capacitor 106 and inductor 110 in parallel with the series capacitance capacitor 104. Resistor 108 models the series resistance of the physical crystal. Ideally, capacitor 106 and inductor 110 cancel each other out at the series resonant frequency of the physical crystal. Circuit designers tend to limit the number of passive components used to model a circuit to reduce the complexity of the simulation.

Mathematical simulation of the crystal circuit shown in FIG. 5 operating at a relatively high frequency, e.g., 25 to 100 MHz, requires calculation of selected output nodes on a relatively small time scale, e.g., every 1 simulated nanosecond, over an extended period of simulated time.

FIG. 6 shows a conventional input buffer of a processor such as the digital signal processor (DSP) Model DSP1640 commercially available from LUCENT TECHNOLOGIES. For accuracy the simulation includes components representing the internal crystal oscillator input buffer circuit, e.g., as shown in FIG. 6, as well as the external components as shown in FIG. 5.

The particular processor 102 used in the exemplary embodiment, the DSP1640, includes a mode wherein the oscillator is halted by the removal of an enable signal to enable line 244. When the enable signal on enable line 244 is logic HIGH, the input buffer of the processor 102 is enabled, and when the enable signal on enable line 244 is logic LOW, the input buffer of the processor 102 is disabled. Hence, when a logic HIGH signal is present on enable line 244, inverter circuit 200, 202 provides a low signal to PMOS FET 204, turning FET 204 on. This provides the power supply voltage, e.g., VDD, across the series-connected driver FETs 206, 208 to allow the input buffer to drive the modeled crystal.

External oscillator input line 240 provides a gate voltage to FETs 206, 208, and external oscillator output line 242 outputs the signal from between the drain of FET 206 and the source of FET 208. Serially-connected FETs 210, 212 are continuously driven on by $V_{DD}$ applied to their gates, and provide a feedback path for the inverting amplifier 250 from the output of the crystal model 120 to the input line 240. When enabled, the simulated internal crystal oscillator circuit shown in FIG. 6 drives an externally-connected physical crystal and causes an approximately sinusoidal voltage output across the input and output nodes of the crystal model 120 shown in FIG. 5.

FIG. 7 shows a graph of the voltage between the input and output nodes of the crystal model 120 every 1 simulated nanosecond, for 40,000,000 simulated nanoseconds (40 simulated microseconds). FIG. 7A is an exploded and exaggerated view of the portion VIIA in FIG. 7 showing that the signal is actually oscillating within the signal envelope 130. A steady state of the peak amplitude of the oscillation of the crystal is not achieved by the mathematical simulation shown in FIGS. 6 and 7 until after about 40,000,000 simulated nanoseconds. Thus, FIG. 7 represents the conventional requirement to calculate and plot 40,000,000 individual values before the simulation reaches a steady state.

Each of these 40,000,000 calculations requires a finite amount of real time, and conventional computers require as long as 20 hours to calculate and plot the output shown in FIG. 7 based on the circuit in FIG. 6. The output of the simulation is not an accurate representation of the modeled circuit until the steady state is reached. Thus, because of the slower achievement of a steady state output using conventional simulation techniques, the manufacture of an integrated circuit including a crystal results in slower product design and longer manufacturing cycles.

SUMMARY OF THE INVENTION

It is therefore desirable to improve upon a conventional crystal model by accelerating the mathematical simulation of a crystal circuit, thus leading to increased design and manufacturing efficiency.

Accordingly, the present invention provides an improved method for modeling a crystal circuit to allow a simulation of the modeled crystal circuit to achieve a steady state very quickly. In the exemplary embodiment, a current source which does not exist in the circuit being modeled is added to the crystal model to drive the output of the crystal model to a steady state level quickly. After a short period of simulation time, the current source added to the crystal model is effectively removed from the circuit simulation.

Using SPICE or other circuit simulation tool, a table of data is input to a circuit command table to establish an oscillating current source. The amplitude of the current output of the oscillating current source for one wavelength of a particular frequency corresponds to the frequency of the crystal being modeled. In the exemplary embodiment, the amplitude of the varying current is sinusoidal and starts at time zero. After the single cycle is completed, the output current of the current source in the simulation is fixed at zero, then effectively removing the current source from the modeled crystal circuit. Thus, after only the first cycle of output, the output of the simulation represents a true and accurate approximation of the operation of the modeled crystal circuit. More than one wavelength of current output from the current source is possible, but dramatic results are achieved after only one cycle of the output current of the current source.

It is therefore an object of the present invention to provide a method of accelerating the simulation of a circuit including a crystal.

It is also an object of the present invention to provide an improved simulation model of a crystal which provides faster simulation results.

BRIEF DESCRIPTION OF THE DRAWINGS

These and other objects, features and advantages of the present invention will become apparent to those skilled in the art from the following description with reference to the drawings, in which.

DETAILED DESCRIPTION OF ILLUSTRATIVE EMBODIMENTS

The present invention relates to the simulation of any electronic circuit containing a crystal by virtually any computer circuit simulation program, perhaps the best known simulation program being SPICE.

Figure 1:
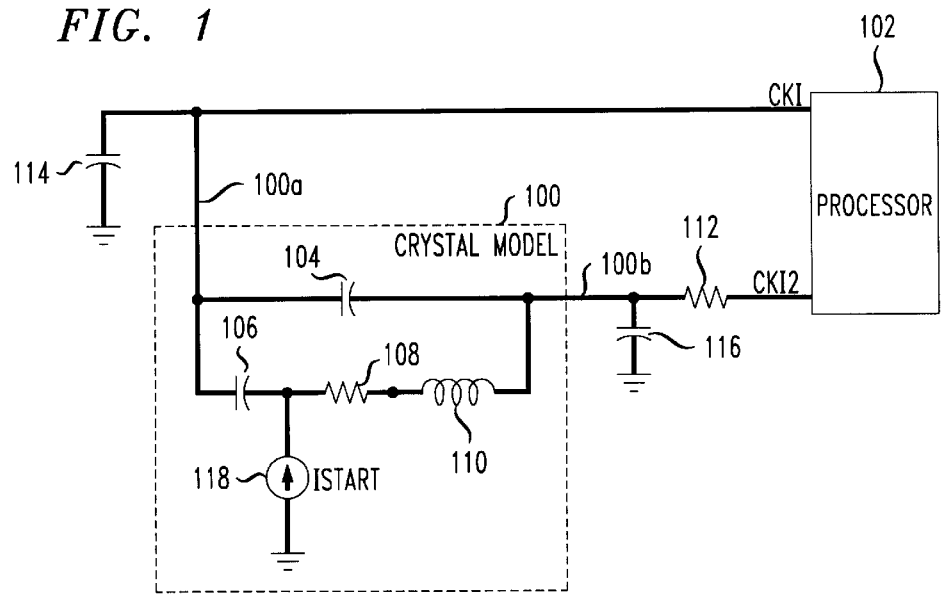
FIG. 1 shows a SPICE model of a typical oscillator circuit with a start up current source used for simulation according to the present invention.

FIG. 1 is a schematic of an exemplary circuit simulation model for a crystal circuit according to the present invention.

According to the present invention, a physical crystal in a circuit being simulated is replaced in the simulation with a crystal model 100, which includes a number of passive components representing various characteristics of the physical crystal being modeled. In addition, according to the present invention, crystal model 100 temporarily includes at least one active component in addition to the passive components to charge at least one passive component in the crystal model 100 depending on the values of the resistors 108 and 112 to accelerate the simulation of the circuit to a steady state.

In particular, the series capacitance of the physical crystal is characterized in the exemplary embodiment of the crystal model 100 with a passive capacitor 104 between the input and output nodes 100a, 100b of the crystal model 100. The capacitance value of the series capacitance capacitor 104 is selected to be approximately equal to the series capacitance of the physical crystal being modeled. The series capacitance is typically specified by the manufacturer of the physical crystal, and in the exemplary embodiment was set at 7 picofarads.

The crystal model 100 further includes a series connection of a capacitor 106, a resistor 108, and an inductor 110 between the input and output nodes 100a, 100b of the crystal model 100. The value of the capacitor 106 is set within the component file of the circuit simulation program to be approximately equal to:

$$\frac{1}{(ws \times q \times rs)}$$

where:

$$ws = 2\pi f$$

f is the frequency of the crystal being modeled, q is the quality factor of the crystal, and rs is the series resistance of the crystal. The resistance of resistor 108 is set to approximately equal the series resistance of the physical crystal, and the inductance of inductor 110 is set approximately equal to:

$$\frac{rs \times q}{ws}$$

n the exemplary embodiment, the series resistance rs of the crystal was 50 ohms, the quality factor q was set at 200, and the frequency f was 44.2368 MHz.

The quality factor of the physical crystal is actually quite larger than the value of 200 used in the simulation, but a lower number provides a faster simulation without sacrificing significant accuracy. Of course, a larger quality factor may be used for increased precision in the simulation. However, with a larger quality factor, the voltage swings across the crystal model 100 can be hundreds of volts. If the quality factor of the crystal is set much lower, i.e., very roughly at about 200, the voltage swings across the crystal model 100 are dramatically reduced.

The active component temporarily included in the crystal circuit in the exemplary embodiment is a current source 118. The current source 118 does not represent any particular characteristic of the physical crystal or the circuit that the physical crystal is being simulated in. Rather, the current source is based solely on the need to accelerate the simulated circuit to a steady state.

The crystal model 100 shown in FIG. 1 is just one implementation of a simulation model for a crystal according to the present invention. The crystal model 100 may include additional or fewer passive components other than those shown in FIG. 1, depending upon the accuracy desired in the crystal model 100 and on the particular characteristics of the physical crystal being modeled. However, in addition to the passive components in the crystal model 100, the present invention provides that the crystal model 100 temporarily includes an oscillating current source 118. The output current of current source 118 is initially non-zero, but eventually is set to zero current for the remainder of the simulation to effectively remove the effects of the same from the circuit, thus allowing an accurate analysis of the subsequent portion of the simulation output without affecting accuracy.

The current source 118 may alternatively be connected between ground and the node between the resistor 108 and inductor 110 instead of between ground and the node between capacitor 106 and resistor 108. Moreover, less preferably it is possible to obtain advantageous acceleration of the simulation results by alternatively connecting the current source 118 between ground and either the input node 100a or output node 100b, but to a lesser extent because of current splitting between capacitors 114, 116 and the internal passive components (i.e., capacitor 106 and inductor 110) in that instance.

The polarity of the current source 118 may be reversed from that shown in FIG. 1 with equivalent results.

The crystal model 100 is connected to the processor 102 through a series resistor 112. Capacitors 114, 116 are placed between the input and output nodes 100a, 100b and ground, as specified by the manufacturer of the physical crystal being modeled.

In the exemplary embodiment, the current output from the current source 118 is sinusoidal at a frequency approximately equal to the rated frequency of the physical crystal. The crystal being modeled in the exemplary embodiment is a 44.2 MHz Model HC49U available from FOX ELECTRONICS in Ft. Myers, Fla.

Although the variation of the current is sinusoidal in the exemplary embodiment based on the resonant frequency of the crystal, it is possible to vary the current source in other ways to achieve acceleration of the simulation. For instance, it may be possible to provide a square wave output from the current source 118 with positive results if one component frequency of the square wave includes the resonant frequency of the crystal.

The initial value of the peak current amplitude of the current source 118 in either the positive or negative direction is set to be equal to about:

$$\sqrt{p/rs}$$

where p is the crystal's power rating, and rs is the crystal's series resistance. Thus, the peak-to-peak current of the current source 118 is initially set to equal about:

$$2 \times \sqrt{p/rs}$$

If the resultant simulation does not reach steady state quickly enough with this initial estimate, then the maximum current amplitude of the current source may be adjusted accordingly and the simulation restarted. If the maximum current amplitude of the current source is chosen with sufficient accuracy, the present invention makes it possible for the modeled crystal circuit to reach a steady state oscillation amplitude within a very small number of calculations.

Passive values of the current output from the current source 118 as a function of time t is determined as follows:

$$I_t = 2\pi ft^* \text{max}$$

This equation is used to develop a list of points such as those shown in Table 1, which can be implemented as a lookup table called by a command file for the circuit simulation program. Table 1 is an exemplary table defining the sinusoidal output current waveform for a ±0.5 milliamp peak current amplitude of the current source 118 having a wavelength of about 35 nanoseconds and thus a frequency of about 28.57 MHz.

TABLE I

| Time (t) | current amplitude of current source $I_t(A)$ |
|---|---|
| 0 ns | 0.0 |
| 1 ns | 9.36906573049505E-5 |
| 2 ns | 0.000184062276365223 |
| 3 ns | 0.00026791339752067 |
| 4 ns | 0.000342273553000228 |
| 5 ns | 0.000404508497223641 |
| 6 ns | 0.000452413526264448 |
| 7 ns | 0.000484291580585739 |
| 8 ns | 0.000499013364220318 |
| 9 ns | 0.000496057350643358 |
| 10 ns | 0.000475528258109548 |
| 11 ns | 0.000438153339956717 |
| 12 ns | 0.000385256621293763 |
| 13 ns | 0.000318711994751077 |
| 14 ns | 0.000240876836899881 |
| 15 ns | 0.000154508497011915 |
| 16 ns | 0.0000626666165868051 |
| 17 ns | −0.0000313952599734496 |
| 18 ns | −0.00012434494379698 |
| 19 ns | −0.000212889645994101 |
| 20 ns | −0.000293892626345355 |
| 21 ns | −0.0003644484313887613 |
| 22 ns | −0.000422163962896075 |
| 23 ns | −0.000464888243048321 |
| 24 ns | −0.000491143625419687 |
| 25 ns | −0.0005 |
| 26 ns | −0.00049114362530439 |
| 27 ns | −0.00046488824282181 |
| 28 ns | −0.000422163962566376 |
| 29 ns | −0.000364484313466405 |
| 30 ns | −0.000293892625847559 |
| 31 ns | −0.000212889645437352 |
| 32 ns | −0.000124344943201001 |
| 33 ns | −0.0000313952593593535 |
| 35 ns | 0.0 |

In the exemplary embodiment processor 102 is a digital signal processor Model DSP1634.5 available from LUCENT TECHNOLOGIES. Although the present embodiment relates to the simulation of a crystal oscillator circuit of a processor, the invention is equally applicable to the simulation of virtually any circuit which includes a crystal.

Figure 2A:
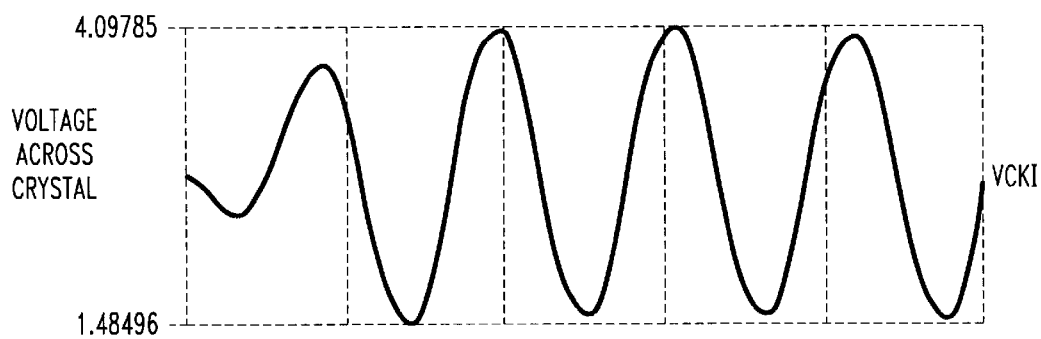
FIG. 2A shows the simulated voltage across the modeled crystal oscillator circuit shown in FIG. 1 with a start up current source used for simulation.

FIG. 2A is a graph of the voltage between the input and output nodes 100a, 100b of the crystal model 100. FIG. 2A shows that the oscillation of the voltage across the input and output nodes 100a, 100b of the crystal model 100 reaches a steady state well within 100 calculations, i.e., before 100 simulated nanoseconds.

Figure 2B:
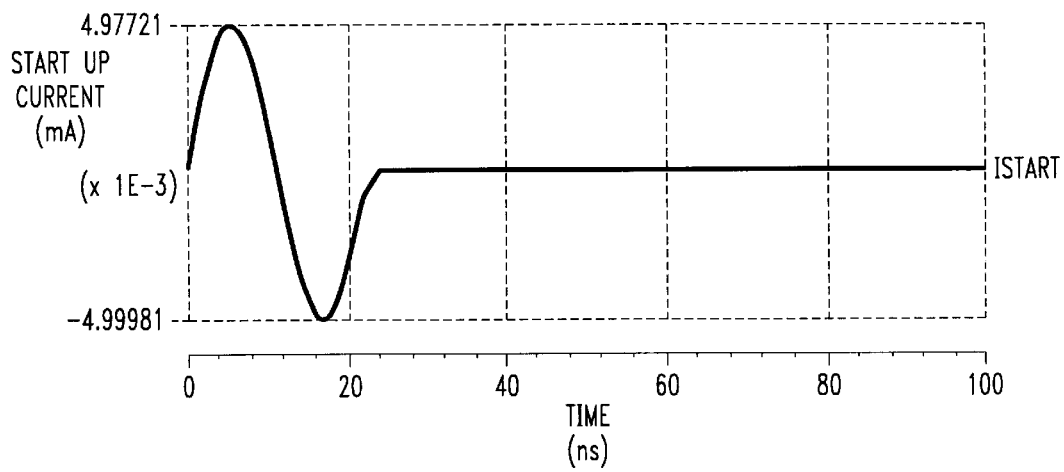
FIG. 2B shows the simulated current output from the start up current source during the simulation of the circuit shown in FIG. 1.

FIG. 2B is a graph of the current output of current source 118 as modeled in the circuit simulation. The current is cycled through one wavelength with a peak current of ±5 milliamps, from 0 to about 25 simulated nanoseconds (i.e., having a frequency of about 44.2 MHz in this example).

Although the inclusion of current source 118 in the crystal model 100 is important, it is also important to select an appropriate peak current amplitude value for a sinusoidally varying current source 118, albeit if only for impressing a single wavelength of oscillating current into the crystal model 100. However, the simulated steady state will be arrived at faster than if the current source 118 were not included in the simulated circuit even if the peak amplitude of the current of the current source 118 is not set to an optimum value.

Figure 3:
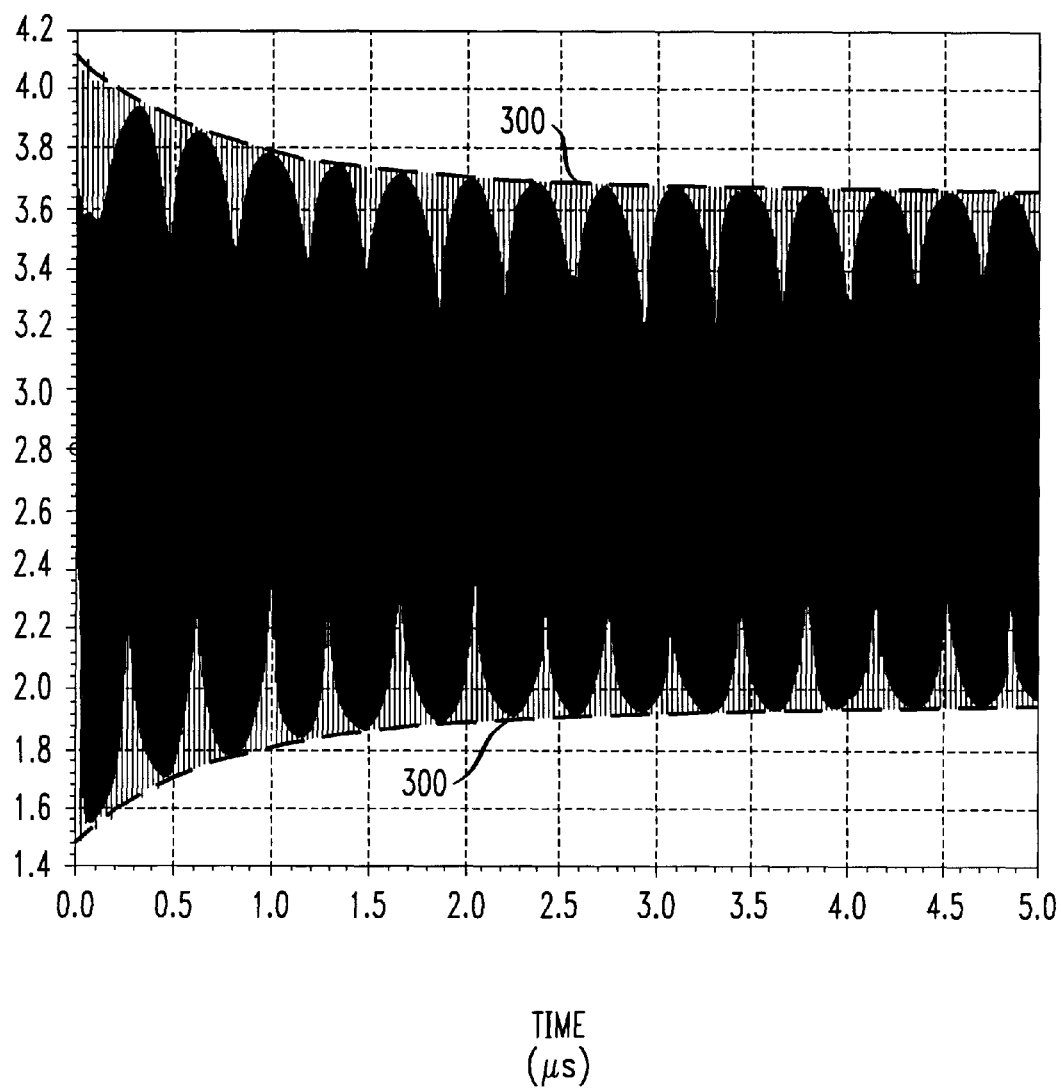
FIG. 3 shows the simulated voltage across the modeled crystal oscillator circuit with Istart set too high.
Figure 5:
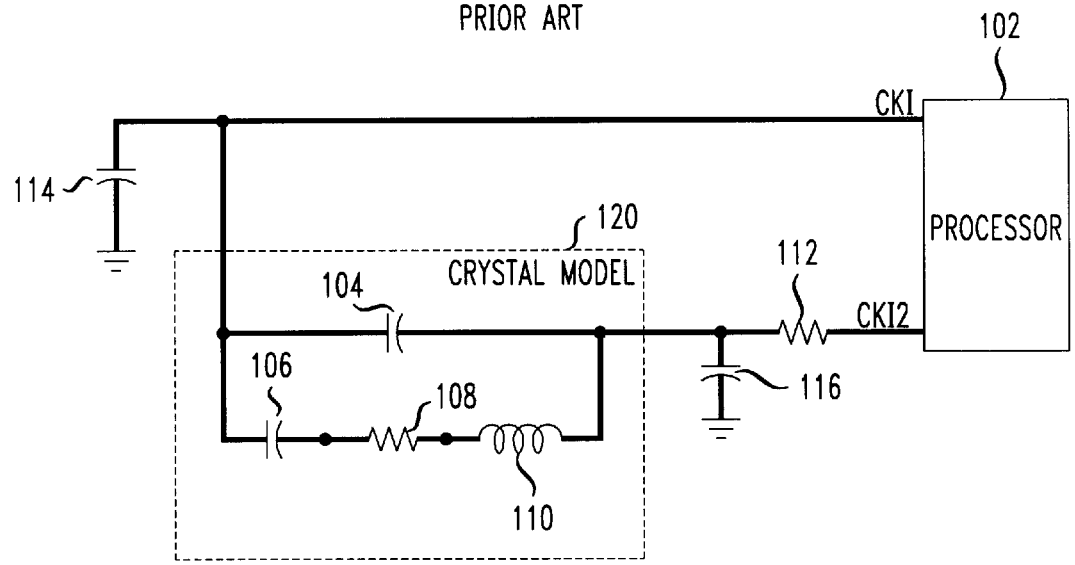
FIG. 5 shows a conventionally-modeled oscillator circuit used for simulation.
Figure 6:
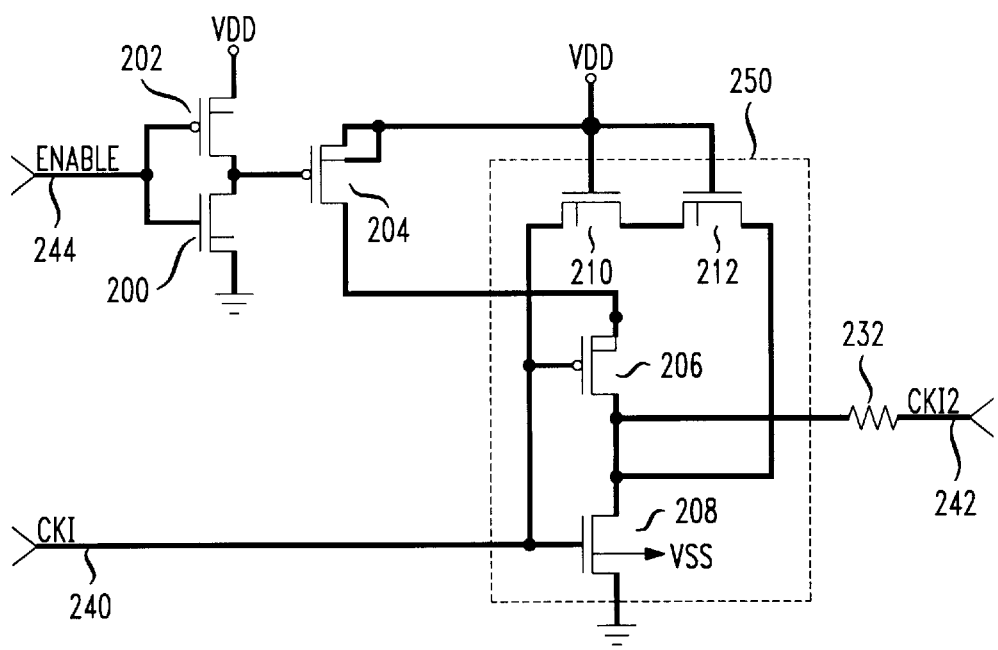
FIG. 6 is a conventional crystal oscillator input buffer circuit for a DSP.
Figure 7:
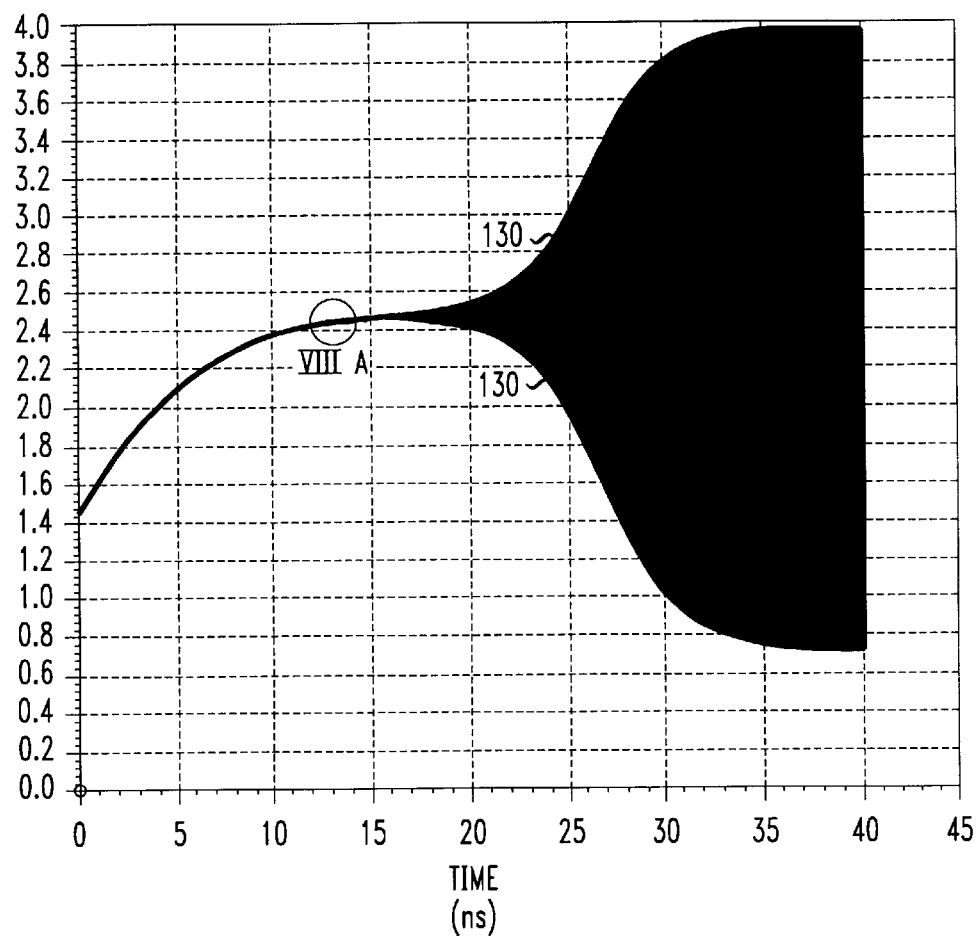
FIG. 7 shows the output sequence of a conventionally-modeled crystal oscillator circuit.
Figure 7A:
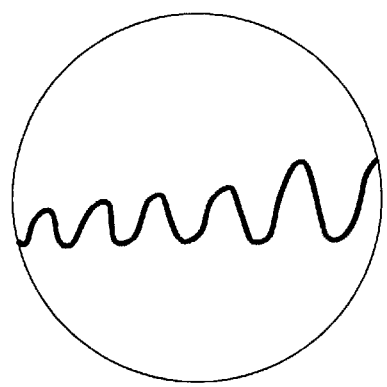
FIG. 7A is an enlarged view of section VIIA in FIG. 7.

For instance, FIG. 3 shows the simulation results if the peak current amplitude of the current source 118 is set too high. A steady state is achieved in FIG. 3 within about 5,000 simulated nanoseconds, or 5,000 calculations, which is a vast improvement over the 40,000,000 simulated nanoseconds required in the prior art crystal circuit model shown in FIG. 5. However, even further improvements in simulation speed can be achieved if a more optimal value for the peak current amplitude of the current source 118 is determined empirically.

FIG. 3 shows the simulated output of the voltage across the input and output nodes 100a, 100b of the crystal model 100 exhibiting a narrowing envelope 300. This narrowing indicates that the value of the peak current amplitude of the current source 118 was set too high. Thus, to speed the simulation toward a steady state even faster, the simulation can be interrupted or stopped, and rerun with an empirically-chosen lower value for the peak current amplitude of the current source 118.

Figure 4A:
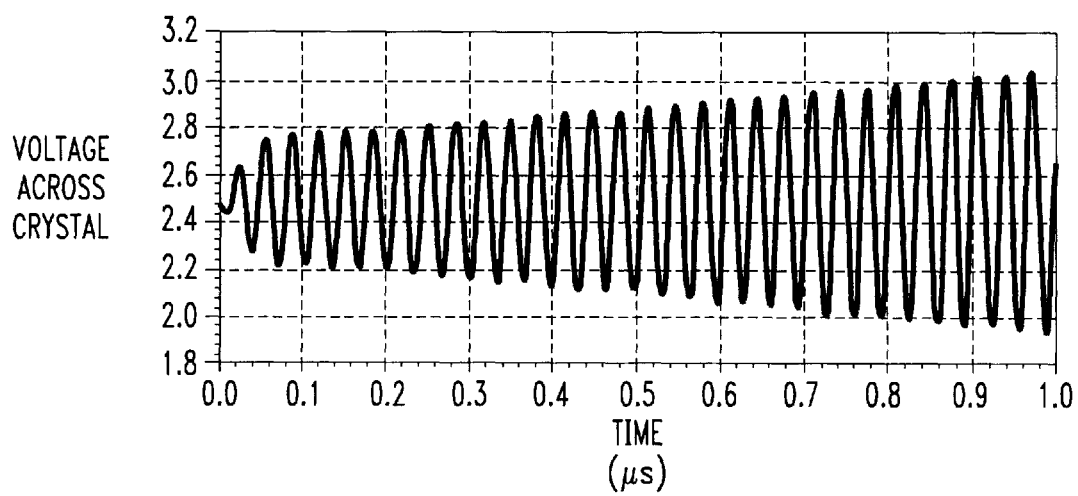
FIG. 4A shows the simulated voltage across the modeled crystal oscillator circuit with Istart set too low.

FIG. 4A is a graph of the simulated voltage across the input and output nodes 100a, 100b of the crystal model 100 when the peak-to-peak current amplitude of the current source 118 is set too low. FIG. 4A shows that the oscillation of the voltage across the input and output nodes 100a, 100b of the crystal model 100 reaches a steady state within about 1,000 simulated nanoseconds, or 1,000 calculations, which again is a significant improvement over the prior art. However, the simulation can reach the steady state even faster if a higher value for the peak current amplitude is input for the output current of current source 118.

Figure 4B:
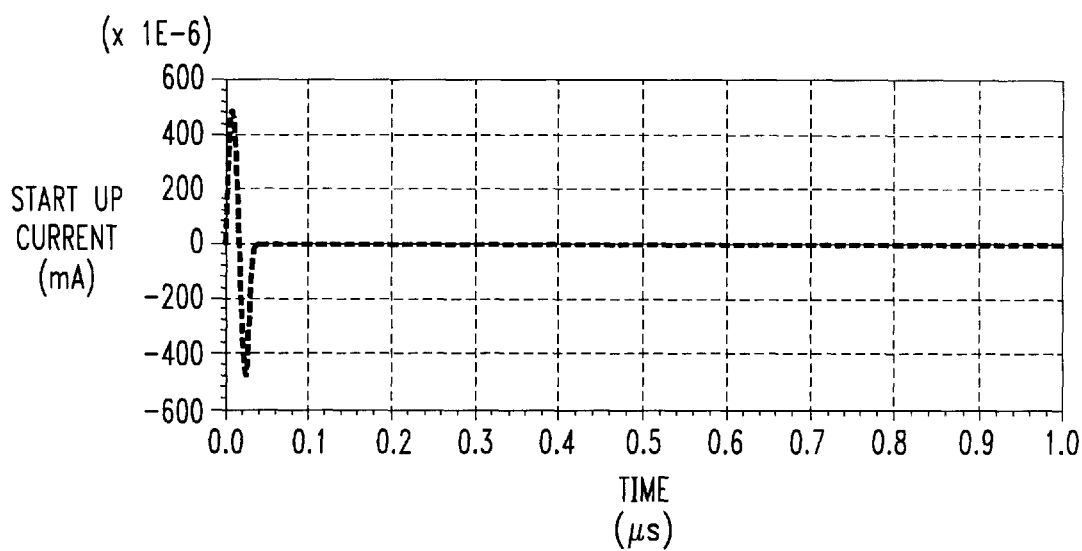
FIG. 4B shows Istart during the simulation of the modeled crystal oscillator circuit output shown in FIG. 4A.

FIG. 4B shows the current output of the current source 118 in the simulation shown in FIG. 4A. Note that the current output is cycled once through one wavelength, from zero to about 0.035 simulated microseconds, and thereafter is forced to zero to effectively remove the current source 118 from the simulated circuit. Also note that although the voltage across the input and output nodes 100a, 100b shown in FIG. 4A begins at time zero, it portrays the simulated circuit more accurately after the current of the current source 118 is forced to zero, i.e., after about 0.035 microseconds in simulated time.

While the invention has been described with reference to the exemplary preferred embodiments thereof, those skilled in the art will be able to make various modifications to the described embodiments of the invention without departing from the true spirit and scope of the invention.

I claim:

1. A method of simulating a physical crystal of an oscillator circuit of a processor, comprising:

selecting a plurality of passive components representing parameters of said physical crystal, to form a model of said physical crystal; and adding an active component to said model of said physical crystal, said active component not corresponds to any parameter of said physical crystal and to any parameter of said processor, and said active component charging at least one of said plurality of passive components;

wherein said physical crystal being modeled is electrical connected to at least one of an external oscillator input line and an external oscillator output line of said processor.

2. The method of simulating a physical crystal according to claim 1, wherein:

said active component is a current source.

3. The method of simulating a physical crystal according to claim 2, wherein:

said current source has a sinusoidal output.

4. The method of simulating a physical crystal according to claim 3, further comprising:

allowing said current source to output said sinusoidal current for a predetermined length of simulation time.

5. The method of simulating a physical crystal according to claim 4, wherein:

said predetermined length of simulation time corresponds approximately to one wavelength of a resonant frequency of said physical crystal.

6. The method of simulating a physical crystal according to claim 1, further comprising;

causing said active component to be inactive after a predetermined portion of simulation time.

7. The method of simulating a physical crystal according to claim 1, wherein said step of selecting said plurality of passive components comprises:

selecting a value of a capacitor to represent a series capacitance of said physical crystal; and selecting a value of a resistor to represent a series resistance of said physical crystal.

8. A method of simulating a physical crystal in an oscillator circuit of a processor with a computer simulation program, comprising:

creating a computer model of said physical crystal having a plurality of passive components and an active component in said computer simulation program, said active component not corresponding to any parameter of said physical crystal and to any parameter of said processor; and providing electrical parameters of said active component to said simulation program to simulate operation of said active component for a predetermined length of simulated time;

wherein said physical crystal being modeled is electrically connected to at least one of an external oscillator input line and an external oscillator output line of said processor.

9. The method of simulating a physical crystal according to claim 8, wherein:

said active component is a current source.

10. The method of simulating a physical crystal according to claim 9, wherein:

said current source has a sinusoidal output.

11. The method of simulating a physical crystal according to claim 10, further comprising:

allowing said current source to output said sinusoidal current for a predetermined length of simulation time.

12. The method of simulating a crystal according to claim 11, wherein:

said predetermined length of simulation time corresponds approximately to one wavelength of a resonant frequency of said crystal.

13. The method of simulating a physical crystal according to claim 8, further comprises;

selecting a value of a capacitor to represent a series capacitance of said physical crystal; and selecting a value of a resistor to represent a series resistance of said physical crystal.

14. A method of simulating a physical crystal in an oscillator circuit of a processor with a computer simulation program, comprising:

selecting electrical parameters for a plurality of passive components in a computer model of said physical crystal;

selecting electrical parameters of an active component in said computer model of said physical crystal, said active component not corresponding to any parameter of said physical crystal and to any parameter of said processor, and said active component charging at least one of said plurality of passive components; and inputting said electrical parameters of said plurality of passive components and said electrical parameters of said active component to said computer simulation program;

wherein said physical crystal being modeled is electrically connected to at least one of an external oscillator input line and an external oscillator output line of said processor.

15. The method of simulating a physical crystal according to claim 14, further comprising:

allowing said simulation program to simulate operation of said active component for a predetermined length of simulated time.

16. The method of simulating a physical crystal according to claim 14, further comprising:

empirically adjusting at least one of said electrical parameters of said active component.

17. A method of simulating a physical crystal in an oscillator circuit of a processor, comprising:

providing a model of said physical crystal, said model having a plurality of passive components representing parameters of said physical crystal and an active component, said active component not corresponding to any parameter of said physical crystal and to any parameter of said processor, and said active component charging at least one of said plurality of passive components; and allowing said active component to operate for a predetermined length of simulation time corresponding approximately to one wavelength of a resonant frequency of said physical crystal;

wherein said physical crystal being modeled is electrically connected to at least one of an external oscillator input line and an external oscillator output line of said processor.

18. The method of simulating a physical crystal according to claim 17, wherein:

said plurality of passive components comprises:

a capacitor to represent a series capacitance of said physical crystal;

a resistor to represent a series resistance of said physical crystal; and an inductor.

19. The method of simulating a physical crystal according to claim 17, wherein:

said active component is a current source.

20. The method of simulating a physical crystal according to claim 19, wherein:

said current source has a sinusoidal output.

21. The method of simulating a physical crystal according to claim 17, further comprising:

empirically adjusting at least one output value of said active component.

22. The method of simulating a physical crystal according to claim 17, further comprising:

providing a list of output values of said active component.

23. The method of simulating a crystal according to claim 19, wherein:

a peak output current of said current source is defined by $$\sqrt{\frac{p}{rs}};$$

wherein p is power rating of said crystal, and rs is series resistance of said crystal.

24. The method of simulating a physical crystal according to claim 21, wherein:

said at least one output value of said active component is defined by $\sqrt{p/rs}$;

wherein p is power rating of said physical crystal, and rs is series resistance of said physical crystal.

* * * * *